U.S. Patent Number: 4,885,230
Date of Patent: Dec. 5, 1989

United States Patent [19]
Stahlhofen et al.

[54] BURN-IN GUMMING COMPOSITION FOR OFFSET PRINTING PLATES

[75] Inventors: Paul Stahlhofen, Wiesbaden; Dieter Mohr, Schlangenbad, both of Fed. Rep. of Germany

[73] Assignee: Hoechst Aktiengesellschaft, Frankfurt am Main, Fed. Rep. of Germany

[21] Appl. No.: 241,790

[22] Filed: Sep. 6, 1988

Related U.S. Application Data

[62] Division of Ser. No. 928,392, Nov. 10, 1982, abandoned.

[30] Foreign Application Priority Data

Nov. 12, 1985 [DE] Fed. Rep. of Germany ....... 3539992

[51] Int. Cl.$^4$ .............................................. G03C 1/52
[52] U.S. Cl. ..................... 430/309; 430/325; 430/326; 430/331
[58] Field of Search ................ 430/309, 331, 325, 326

[56] References Cited

U.S. PATENT DOCUMENTS

| | | | |
|---|---|---|---|
| 3,885,969 | 5/1975 | Kruck ................... | 430/490 |
| 4,191,570 | 3/1980 | Herting et al. ....... | 430/302 |
| 4,340,655 | 7/1982 | Hamster et al. ...... | 430/14 |
| 4,424,273 | 1/1984 | Franco et al. ........ | 430/529 |
| 4,520,088 | 5/1985 | Senga et al. .......... | 430/49 |
| 4,578,342 | 3/1986 | Sekiya ................... | 430/159 |

FOREIGN PATENT DOCUMENTS

1555233 11/1979 United Kingdom.

*Primary Examiner*—Paul R. Michl
*Assistant Examiner*—Patrick A. Doody
*Attorney, Agent, or Firm*—Foley & Lardner, Schwartz, Jeffery, Schwaab, Mack, Blumenthal & Evans

[57] ABSTRACT

A burn-in gumming composition for irradiated and developed offset printing plates comprises water and a water-soluble polymer or copolymer for protecting the plate surface during the burning-in step and during long-term storage. The polymer or copolymer used contains sulfonic acid groups and/or alkali metal sulfonate or ammonium sulfonate groups.

4 Claims, No Drawings

BURN-IN GUMMING COMPOSITION FOR OFFSET PRINTING PLATES

This application is a division of application Ser. No. 928,392 filed Nov. 10, 1986 now abandoned.

BACKGROUND OF THE INVENTION

The invention relates to a burn-in gumming composition for irradiated and developed offset printing plates.

Offset printing plates in general comprise: (a) a two-dimensional carrier material of metals and/or plastics, the surface of which can be modified, for example, by roughening (etching) and/or anodic oxidation, and (b) at least one radiation-sensitive (photosensitive) coating (reproduction layer). Particularly in the case of positive-working reproduction layers, but in principle also with negative-working reproduction layers, the preparation of a printing form with the basic process steps of irradiation, development and gumming (preserving, desensitizing) also includes a burn-in step between the last two steps. Applied to positive-working reproduction layers, the procedure can be illustrated as follows. During the imagewise irradiation (exposure), those parts of the reproduction layer which are struck by electromagnetic energy (light) become soluble, and the unaffected parts remain insoluble (in each case relative to the developer to be used). As a result of the first-mentioned parts being dissolved out in the developing step, the non-image areas, which are water-bearing during the later printing from the printing form, are formed on the surface of the printing plate after the development of the irradiated reproduction layer, and the image areas which are inkbearing during later printing are formed from the lastmentioned parts. In practice, it has been found that heating of the irradiated and developed printing plate -depending on the nature of the carrier material and/or the production layer - to more than 180° C can lead to longer print runs with the printing form thus resulting. This process is called "burning-in". The burning-in achieves a consolidation of the image areas, the latter becoming, for example, insoluble in the usual organic solvents and resistant to the action of chemicals.

During burning-in, constituents of the image areas (i.e., of the reproduction layer), for example, constituents of the binder, can also pass into the nonimage areas and hence adversely affect the hydrophilic character of the latter, leading, for example, to toning (absorption of printing ink in the non-image areas). Therefore, it was necessary, in the initial phase of using a burning-in step, to remove the impurities in the non-image areas again by means of relatively aggressive solutions.

In the course of time, so-called "burning-in aids" were developed which at least facilitated this after-cleaning. However, as a rule, after-cleaning nevertheless still required cleaning of the non-image areas with water before the actual printing process. The burning-in aids known from the state of the art include, inter alia, the following examples.

German Patent No. 2,318,286 (corresponding to U.S. Pat. No. 3,745,011) discloses a process for the preparation of negative resist images, wherein a photoresist is treated, after exposure and development and before a burn-in process, with a solution of a cycloaliphatic, heterocyclic, or aromatic polycarboxylic acid or an aromatic sulfonic acid. The photosensitive layers of the photoresists used contain natural proteins, such as fish glue, and ammonium bichromate. This treatment before burning-in is intended to: (a) lower the burning-in temperature; (b) increase the etch resistance of the resist image; and (c) improve the stripoability of the resist image or the applied photoresist. The acids used include, inter alia, p-toluenesulfonic acid, 2-napthalenesulfonic acid, naphthalene-1,8-disulfonic acid, benzenesulfonic acid, and 1,3-benzenedisulfonic acid, which are employed preferably in the form of a 1 to 25 % solution. Steel is used exclusively as the carrier material for the coating with photoresist. The application for printing plates and the special problems with burning-in in that case are not mentioned.

German Patent No. 2,530,422 (corresponding to British Patent Specification No. 1,513,368) discloses a process for the preparation of printing forms, plates for printed circuits, integrated circuits and the like, wherein the exposed and developed carriers are, before burning-in, provided with a protective layer at least on the non-image areas. This protective layer remains on the carrier during burning-in and can, after burning-in, be removed by means of water together with a precipitate which settles on the protective layer during burning-in. The protective layer is applied in the form of an about 2.5 to 45% aqueous solution of one of the following compounds: sodium dodecylphenoxybenzenedisulfonate, a sodium salt of an alkylated naphthalenesulfonic acid, disodium methylenedinaphthalenedisulfonate, sodium dodecylbenzenesulfonate, a sodium salt of a sulfonated alkyldiphenyl oxide, an ammonium perfluoroalkylsulfonate, a potassium perfluoroalkylsulfonate, sodium dioctylsulfosuccinate, sodium di-(methylamyl)-sulfosuccinate, and lithium nitrate.

In British Patent Specification No. 1,575,200 a water-soluble hydrocolloid from the group comprising gum arabic, sodium carboxymethylcellulose, or alginate is also added to an aqueous solution for producing the protective layer before burning-in, in addition to one of the compounds listed above. The mixture of substances used is intended to comprise 85 to 98% by volume of one of the compounds known from British Patent Specification No. 1,513,368, and 2 to 15% by volume of one of the hydrocolloids, and it is employed in a 10 to 50% by volume aqueous solution. After burning-in, the printing forms are washed with water and can then be clamped into a printing press.

The burn-in aid according to German Patent No. 2,625,336 (corresponding to U.S. Pat. No. 4,063,507) is boric acid or a borate and is employed in solid form or preferably in a 3 to 10% aqueous solution.

According to German Offenlegungsschrift No. 2,626,473 (corresponding to British Patent Specification No. 1,555,233), it is possible, in place of the compounds already described above as suitable for the burning-in of printing plates (burn-in aids), also to use, inter alia, various hydrophilic polymers such as gum arabic, dextrin, polyvinyl alcohol, cellulose ethers, homopolymers and copolymers based on acrylic or methacrylic acid or a copolymer of alkyl acrylate and vinylmethylacetamide or also salts of organic acids such as di-sodium anthraquinone-2,7-disulfonate, tri-sodium naphathalene1,3,5-trisulfonate, tri-sodium 1-naphthylamine-4,6,8-trisulfonate, or tri-sodium 1-naphthol-3,6,8-trisulfonate. The compounds are used in aqueous solution in a concentration from 0.1% up to saturation.

European Patent Application No. 0,043,991 (corresponding to U.S. Pat. No. 4,355,096) lists amines containing carboxyl groups, such as ethylenediaminetetraacetic acid, nitrilotriacetic acid or salts thereof as burn-in aids, and U.S. Pat. No. 4,191,570 lists salts or salt-like reaction products of naphthalene, formaldehyde and sulfuric acid.

However, all the known burn-in aids still have serious disadvantages. For example, they can effect a reduction in the oleophilic character of the image areas, and they can lead to staining of the printing plate surface and, particularly in the case of insufficient postcleaning with water or aqueous developer solutions, to interference with the water/printing ink balance during the later printing. In operating instructions for the use of many of the known burn-in aids, these problems are specifically pointed out, and it is stated that these problems can be overcome, for example, by dry rubbing of the printing plate surface before burning-in, by careful rinsing or even (for example in European Patent Specification 0,012,956 (corresponding to U.S. Pat. No. 4,265,999)) or by providing hydrophilic properties by posttreatment/cleaning with an aqueous solution of a hydrophilic polymer such as polyvinylphosphonic acid. Such special posttreatments providing hydrophilic properties, or one of the conventional gumming (preserving) post-treatments are possible in principle, but require an additional working step in the preparation and use of a printing form. A combination of the two steps in a burning gumming is described in British Patent Soecification No. 1,575,200, described above, but it still leads to a large consumption of paper in the printing press as, without additional intermediate cleaning, the printing form is too slow to run clean.

In European Patent Application No. 0,155,620, a burn-in gumming is proposed which comprises several components, including a hydrophilic polymer, a water-soluble organic carboxylic or sulfonic acid or one of their water-soluble salts, a hydroxycarboxylic acid and/or salts thereof, an alkanediol and a surfactant. A printing form treated with this burn-in aid need no longer be washed off after burning-in but can be clamped directly into the printing press. In this case, a relatively large number of components is employed, and it can happen that, in the event of unduly thick preservation, as is frequently the case in practice with manual treatment, the printing stencil can be extensively damaged during burning-in, so that perfect printing of long runs is no longer possible.

SUMMARY OF THE INVENTION

It is therefore an object of the present invention to provide a burn-in gumming composition which does not have the aforementioned disadvantages, which prevents precipitation of impurities on the plate surface during heating of the printing form, which protects the printing form from contamination during storage, and which keeps the non-printing surface areas permanently hydrophilic.

In accomplishing the foregoing objects, there has been provided in accordance with one aspect of the present invention a burn-in gumming composition for irradiated and developed offset printing plates, used for protecting the plate surface during the burning-in step and during long-term storage, comprising an aqueous solution comprising water and a water-soluble polymer or copolymer, wherein the polymer or copolymer comprises monomers selected from the group consisting of sulfonic acids, alkali metal sulfonates, and ammonium sulfonates.

In another aspect of the invention, there is provided a method for burning-in irradiated and developed offset printing plates comprising the steps of coating at least one surface of an irradiated and developed offset printing plate with a burn-in gumming composition comprising an aqueous solution comprising water and a water-soluble polymer or copolymer, wherein the polymer or copolymer comprises monomers selected from the group consisting of a sulfonic acid, an alkali metal sulfonate, and an ammonium sulfonate, and then heating the coated printing plate for a sufficient time to effect burning-in, wherein the temperature to which the coated printing plate is heated ranges from about 150 to 300° C, and preferably from about 200 to 230° C, for between 0.5 and 10 minutes in order to effect burning-in.

DETAILED DESCRIPTION OF PREFERRED EMBODIMENTS

The invention starts from a burn-in gumming composition for irradiated and developed offset printing plates, comprised of water and a water-soluble polymer or copolymer. In the burn-in gumming according to the invention, the polymer or copolymer contains sulfonic acid groups and/or alkali metal sulfonate or ammonium sulfonate groups.

According to the invention, those polymers or copolymers are particularly suitable which contain, as monomer units, styrenesulfonic and/or methylstyrenesulfonic acids in the form of their water-soluble salts. Polymers comprising, as monomer units, aliphatic sulfonic acid groups as such, or in the form of their water-soluble salts, are also suitable, such as, for example, polyvinylsulfonic acid and its alkali metal salts, or copolymers which contain, as monomer units, vinylsulfonic acid or acrylamidopropanesulfonic acids or salts thereof. Polymers comprising partially or fully saponified polyvinyl acetate are also suitable, the polyvinyl alcohol units being partially acetalized with butyraldehyde-4-sulfonic acid.

The polymers or copolymers according to the invention preferably have a molecular weight between 1,500 and 500,000.

The polymer or copolymer used according to the invention combines, in terms of effect, in a single component the components hitherto employed in the known burn-in gumming compositions (a) for avoiding contamination of the background during burning-in, and (b) for preserving the printing form for the purpose of storage for a prolonged period. The burn-in gumming composition according to the invention contains, in particular, 1 to 50% by weight, and preferably 3 to 20% by weight, of the alkali metal or ammonium salt of a sulfonated polystyrene.

In different embodiments, the burn-in gumming compositions can also contain hydroxypolycarboxylic acids, such as citric acid and/or its salts, in a proportion of 0.10 to 5%, and surfactants (preferably anionic or nonionic surfactants) such as alkylarylsulfonates (for example di-sodium diisobutylnaphthalene-disulfonate), or a natural surfactant (for example saponin) in a proportion of 0.01 to 5%.

The procedure when using the burn-in gumming composition can be such that the surface or, in the case of double coating with a reproduction layer, both surfaces, of the irradiated and developed offset printing plate are rubbed with a dabber which has been impregnated with the burn-in gumming composition. However, other methods of application, such as dipping, spraying, whirler-coating or pouring-on, are also possible, and can be carried out either by hand or by automatic processing machines. Advantageously, the surface of the printing plate provided with the burn-in gumming composition is dried before burning-in. Drying can also take place, however, during the subsequent burning-in.

The layer weight of the burn-in gumming composition after drying is generally in the range from 0.05 to 20 g/m$^2$. The printing plate thus treated is then burned-in at a temperature of 150 to 300° C, and in particular 200 to 230° C, in a burning-in stove, with the burning-in times usually being 0.5 to 10 minutes. Apart from the hot-air ovens used in practice, other types of treatment have also been described, most recently for example, irradiation with quartz-halogen lamps according to German Patent No. 1,955,378, with infrared radiation according to German Patent No. 2,201,936 or with UV lamps according to German Offenlegungsschrift No. 3,110,632.

The conventional offset printing plates used in practice, of metal and/or heat-stable plastic, can be treated with the burn-in gumming composition according to the invention, but the latter is particularly suitable for those offset printing plates which have a mechanically, chemically, and/or electrochemically roughened and, if appropriate, anodically oxidized carrier material of aluminum or one of its alloys. These carrier materials can carry negative-working or positive-working reproduction layers which contain one of the known radiation-sensitive compounds such as diazo, diazonium or azido compounds, or photopolymerizable compounds (see, for example, Jaromir Kosar, "Light-sensitive systems", John Wiley & Sons, New York, 1965). However, the burn-in gumming composition according to the invention is particularly suitable for positive-working reproduction layers which in general contain, in addition to the actual radiation-sensitive compound, resins, in particular novolaks or resols, and also various other components such as dyes, adhesion promoters or leveling agents. The radiation-sensitive compounds in these reproduction layers include in particular the o-quinonediazides, preferably o-naphthaquinone-diazides such as 1,2-naphthoquinone-2-diazide-sulfonic acid esters or amides which can be of low or higher molecular weight. In this connection, see, for example, German Patent Nos. 854,890, 865,109, 879,203, 894,959, 938,233, 1,109,521, 1,144,705, 1,118,606, 1,120,273, 1,124,817 and 2,331,377 and European Patent Application Nos. 0,021,428 and 0,055,814.

For positive-working copying layers, materials based on compounds cleavable by acid can also be used very successfully. Copying material of this type is known and described in, for example, U.S. Pat. Nos. 3,779,778 and 4,101,323, German Patent No. 2,718,254 and German Offenlegungsschriften No. 2,928,636 and No. 2,829,512 and No. 2,829,511. They contain, as the compounds cleavable by acid, orthocarboxylic acid derivatives, monomeric or polymeric acetals, enol ethers or acyliminocarbonates. As the radiation-sensitive acidreleasing compounds, they predominantly contain organic halogen compounds, in particular s-triazines substituted by halomethyl groups, or 2-trichloromethyl-1,3,4oxadiazoles.

The burn-in gumming composition according to the invention provides the effect, known from the burn-in aids, of easy removal of contamination from the non-image areas of offset printing plates. In addition, however, it obviates washing-off of the protective layer applied and/or application or renewal/touching-up of gumming (preserving). A printing form provided with the burn-in gumming according to the invention runs clean in the printing press in a surprisingly short time and ensures rapid absorption of ink by the image areas, coupled with simultaneous freedom of the non-image areas from tone.

It is a particular advantage that, in contrast to the burn-in aids hitherto known, the contamination of the background which occurs during the burn-i step is prevented, and permanent preservation of the printing form is achieved with only a single component. A further advantage is that the burn-in gumming compositions according to the invention do not form any sparingly soluble alkaline earth metal salts, so that no further complex formers, such as, for example, nitrilotriacetic acid, which very often are the cause of the attack on the layer during burning-in, need be added to the burn-in gumming composition.

In the preceding description and the following examples, percent data are always percent by weight, unless otherwise stated, and parts by weight have the same relationship with parts by volume as the g with the cm$^3$.

Example 1

An electrochemically roughened and anodized aluminum plate is coated with a positive-working radiationsensitive mixture of 1.200 parts by weight of the esterification product
  obtained from 1 mole of ethoxyethyl
  4,4-bis-(4-hydroxyphenyl)n-valerate
  and 2 moles of
  1,2-naphthoquinone-2-diazide-5sulfonic
  acid chloride,
6.800 parts by weight of a novolak prepared by condensation
  of a technical cresol mixture
  with formaldehyde, having a
  melting point of 108 to 118° C,
0.070 part by weight of crystal violet, and
0.200 part by weight of 1,2-naphthoquinone-2-diazide4-sulfonic
acid chloride in
50.00 parts by weight of ethylene glycol monomethyl ether, and
50.00 parts by weight of tetrahydrofuran.

Before application of the light-sensitive copying layer, the anodized carrier had been treated with an aqueous solution of 0.1% by weight of polyvinylphosphonic acid.

The offset printing plate thus prepared, having a reproduction layer with a weight of 2.30 g/m$^2$, is exposed imagewise under a transparent positive original and then developed with the following solution:

5.3 parts by weight of Na$_2$SiO$_3$ . 9 H$_2$0,
3.4 parts by weight of Na$_3$PO$_4$. 12 H$_2$0, and
0.3 parts by weight of NaH$_2$PO$_4$ anhydrous in
91.0 parts by weight of H$_2$0.

As a result of the development, those areas of the reproduction layer which have been struck by the light are removed, and the unexposed parts remain as image areas on the carrier material, so that a printing stencil corresponding to the original is obtained. About 100,000 perfect prints can be obtained i a printing press from a printing form thus prepared. In order to attain a multiple of this length of run, the printing plate must also be burned-in in a manner known per se. For this purpose, the exposed and developed printing plate is wiped, by means of a dabber, with the following burn-in gumming composition comprised of 5% aqueous solution of the sodium salt of a polystyrenesulfonic acid having a molecular weight of about 70,000, and dried, with care being taken to ensure that a coherent film is formed across the entire surface of the printing form.

The printing form provided with a protective layer is then burned-in for 5 minutes at 230° C in a commercially available hot-air oven. The printing form thus prepared can be clamped immediately into the printing press and subjected to the conventional printing process without it being necessary to remove the protective layer first with water and/or to treat the printing form, if appropriate, again with a preserving agent such as, for example, gum arabic. Already after 4 revolutions of the dampening rollers and inking rollers of the printing press, complete ink absorption by the printing stencil coupled with simultaneous freedom of the background from tone is achieved, so that perfect prints are obtained at the latest after 6 sheets of paper ("spoilage").

If the burn-in gumming composition used according to the invention in Example 1 is replaced by one of the examples according to European Patent Application No. 0,155,620, perfect prints are obtained only after 15 to 20 sheets of paper (spoilage) under the same test conditions. Even with a relatively thick preservation of the printing form with the burn-in gumming composition indicated in Example 1, the printing stencil is not damaged during the burn-in process, so that perfect ink absorption is ensured also during continued printing. By contrast, the burn-in aids indicated by European Patent Application No. 0,155,620 show, in the event of unduly thick preservation, and above all in the areas where drops of the burn-in gumming were not distributed but remained as dried-up spots, extensive attack on the layer during burning-in.

If a presensitized offset printing plate prepared according to Example 1 is treated under the same test conditions before burning-in with an aqueous solution of 7% of gum arabic and 22% of di-sodium dodecylphenoxybenzenedisulfonate according to Example 1 of British Patent Soecification No. 1,575,200 and the printing plate thus pretreated is burned-in and clamped into the printing press without washing off the protective layer, no perfect proof is obtained even after 100 sheets of paper have passed through. A similarly unsatisfactory result is obtained if sodium carboxymethylcellulose is used in place of gum arabic.

Printing forms prepared according to German Offenlegungsschrift No. 2,626,473 or German Patent No. 2,625,336 with, for example, $Na_2B_4O_7$ or $Na_2HPO_4$ as the burn-in aid also cannot give a perfect proof if the corresponding protective layers are not washed off with water before the actual printing process.

A further advantage of the polystyrenesulfonic acids used according to the invention is that the latter form readily soluble alkaline earth metal salts so that no turbidity is produced in the burn-in gumming compositions even when large quantities of relatively hard water are added. This is in contrast to many of the hitherto claimed burn-in aids, in which organic carboxylic, sulfonic or phosphonic acids are used, all of which form more or less sparingly soluble alkaline earth metal salts. If, for example, 100 ml of water of 35 degrees German hardness are added to 1 ml of the burn-in aid indicated in Example 3 of European Patent Application No. 0,155,620, or 1 ml of the burn-in aid indicated in Example 2 of British Patent Soecification No. 1,513,368, considerable turbidity is produced after brief standing, whereas no turbidity is observable under the same test conditions with the burn-in gumming composition claimed according to the invention even after addition of 1000 ml of the same water. Such turbidity or precipitations in the burn-in gumming compositions, caused by entrained developer and/or water residues from the upstream tanks, can arise in particular in the automatic processing units where exposure, development, and preservation are carried out in one working step.

The burned-in printing plate provided with the burn-in gumming composition according to the invention can also be stored at room temperature over a period of several months without the disadvantages of, for example, a tone appearing in the image-free areas arising during a printing run started at a later date.

In the examples which follow, further burn-in gumming compositions are indicated with which the printing plate prepared according to Example 1 is treated before burning-in, perfect prints being obtained in the printing press within relatively short time, similarly to Example 1. Unless specially noted, the preparation and processing of the printing plates thus obtained correspond to the conditions described in Example 1.

Example 2

The following burn-in gumming composition is used:
3.00 parts by weight of the sodium salt of a polystyrenesulfonic
acid having a molecular
weight of about 500,000, and
97.00 parts by weight of distilled water.

Example 3

The following burn-in gumming composition is used:
4.00 parts by weight of the sodium salt of a polystyrenesulfonic
acid according to
Example 1,
1.00 parts by weight of calcium citrate,
0.20 part by weight of citric acid, and
94.80 parts by weight of distilled water.

Example 4

The following burn-in gumming composition is used:
3.00 parts by weight of the sodium salt of a polystyrenesulfonic
acid according to
Example 2,
0.05 part by weight of the sodium salt of 1,2-isopropylnaphthalenesulfonic
acid
(anionic surfactant), and
96.95 parts by weight of distilled water.

Example 5

The following burn-in gumming composition is used:
4.00 parts by weight of a copolymer of styrenesulfonic acid (sodium salt) and maleic
anhydride in a 3:1 ratio,
2.00 parts by weight of potassium citrate,
0.50 part by weight of citric acid, and
93.50 parts by weight of distilled water.

Example 6

The following burn-in gumming composition is used:
5.00 parts by weight of a partially saponified polyvinyl acetate, the alcoholic groups
of which are acetalized with
butyraldehyde-4-sulfonic acid, and
95.00 parts by weight of distilled water.

Example 7

The following burn-in gumming composition is used:
3.00 parts by weight of a copolymer comprised of 20%
acrylamidopropanesulfonic acid and
80% vinylphosphonic acid, and
97.00 parts by weight of distilled water.

Example 8

The following burn-in gumming composition is used:
5.00 parts by weight of a copolymer comprised of 40%
vinylsulfonic acid and 60%
vinylphosphonic acid, and
95.00 parts by weight of distilled water.

WHAT IS CLAIMED IS:

1. A method for burning-in irradiated and developed offset printing plates, comprising the steps of:

(a) coating at least one surface of an irradiated and developed offset printing plate with a burn-in gumming composition comprising an aqueous solution comprising water and from about 1 to 50% by weight of a water-soluble polymer or copolymer, wherein the polymer or copolymer comprises monomers selected from the group consisting of styrenesulfonic acid, methylstyrenesulfonic acid, vinylsulfonic acid, acrylamidopropanesulfonic acid, vinyl acetate, and the water-soluble salts thereof; and then (b) heating said printing plate for a sufficient time to effect burning-in.

2. A method as claimed in claim 1, wherein step (b) comprises heating said printing plate to a temperature of between about 150 to 300° C to effect burning-in.

3. A method as claimed in claim 1, wherein step (b) comprises heating said printing plate to a temperature of between about 200 to 230° C to effect burning-in.

4. A method as claimed in claim 1, wherein step (b) comprises heating said printing plate for about 0.5 to 10 minutes to effect burning-in.

* * * * *